(12) United States Patent
Donolo

(10) Patent No.: US 10,523,150 B2
(45) Date of Patent: Dec. 31, 2019

(54) SYSTEMS AND METHODS FOR MOTOR SLIP CALCULATION USING SHAFT-MOUNTED SENSORS

(71) Applicant: Schweitzer Engineering Laboratories, Inc., Pullman, WA (US)

(72) Inventor: Marcos A. Donolo, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 248 days.

(21) Appl. No.: 15/667,382

(22) Filed: Aug. 2, 2017

(65) Prior Publication Data

US 2018/0076753 A1 Mar. 15, 2018

Related U.S. Application Data

(60) Provisional application No. 62/395,113, filed on Sep. 15, 2016.

(51) Int. Cl.
| | | |
|---|---|---|
| H02P 29/024 | (2016.01) | |
| G01P 3/481 | (2006.01) | |
| G01D 5/34 | (2006.01) | |
| H02H 7/08 | (2006.01) | |
| H02P 23/14 | (2006.01) | |
| G01P 3/48 | (2006.01) | |
| G01R 31/34 | (2006.01) | |
| H04B 7/24 | (2006.01) | |
| G01S 11/02 | (2010.01) | |

(52) U.S. Cl.
CPC ............ *H02P 29/024* (2013.01); *G01D 5/34* (2013.01); *G01P 3/481* (2013.01); *G01S 11/02* (2013.01); *H02P 29/0241* (2016.02); *G01P 3/48* (2013.01); *G01R 31/343* (2013.01); *H02H 7/0805* (2013.01); *H02H 7/0833* (2013.01); *H02P 23/14* (2013.01); *H04B 7/24* (2013.01)

(58) Field of Classification Search
None
See application file for complete search history.

(56) References Cited

U.S. PATENT DOCUMENTS

| | | |
|---|---|---|
| 3,921,047 A | 11/1975 | Carter |
| 4,142,591 A | 3/1979 | Himmelstein |
| 4,218,718 A | 8/1980 | Sun |
| 4,228,396 A | 10/1980 | Palombo |
| 4,229,694 A | 10/1980 | Wilson |

(Continued)

OTHER PUBLICATIONS

Demetrios A. Tziouvaras, Daqing Hou, Schweitzer Engineering Laboratories, Inc., Out-Of-Step Protection Fundamentals and Advancements, Jan. 1, 2003.

(Continued)

*Primary Examiner* — John C Kuan
(74) *Attorney, Agent, or Firm* — Justin K. Flanagan; Richard M. Edge

(57) ABSTRACT

Systems and methods are disclosed herein for monitoring and detecting a loss of synchronism in an electric motor, such as a synchronous motor. A monitoring system may compare a measured or provided electric power system frequency with a measured rotational frequency of the rotor of the electric motor. The rotational frequency of the rotor may be obtained from a shaft-mounted device. The monitoring system may determine a slip condition and/or a loss of synchronism of the electric motor.

19 Claims, 13 Drawing Sheets

(56) References Cited

U.S. PATENT DOCUMENTS

| | | | |
|---|---|---|---|
| 4,450,403 A | 5/1984 | Dreiseitl | |
| 4,463,306 A | 7/1984 | de Mello | |
| 4,506,339 A | 3/1985 | Kuhnlein | |
| 4,761,703 A | 8/1988 | Kliman | |
| 4,766,370 A | 8/1988 | Carr | |
| 4,991,429 A | 2/1991 | Stacey | |
| 5,030,917 A | 7/1991 | Kliman | |
| 5,418,442 A | 5/1995 | Araki | |
| 5,537,322 A | 7/1996 | Denz | |
| 5,541,488 A | 7/1996 | Bansal | |
| 5,646,499 A * | 7/1997 | Doyama | H02P 23/08 318/801 |
| 5,793,750 A | 8/1998 | Schweitzer | |
| 6,172,509 B1 | 1/2001 | Sash | |
| 6,245,066 B1 | 6/2001 | Morgan | |
| 6,308,140 B1 | 10/2001 | Dowling | |
| 6,456,946 B1 | 9/2002 | O'Gorman | |
| 6,476,521 B1 | 11/2002 | Lof | |
| 6,642,700 B2 | 11/2003 | Slade | |
| 6,662,124 B2 | 12/2003 | Schweitzer | |
| 6,845,333 B2 | 1/2005 | Anderson | |
| 6,873,931 B1 | 3/2005 | Nower | |
| 6,934,654 B2 | 8/2005 | Benmouyal | |
| 6,947,264 B2 | 9/2005 | Gill | |
| 6,947,269 B2 | 9/2005 | Lee | |
| 7,285,949 B2 | 10/2007 | Bruns | |
| 7,336,455 B2 | 2/2008 | Dimino | |
| 8,092,174 B2 | 1/2012 | Egedal | |
| 8,248,060 B2 | 8/2012 | Schweitzer | |
| 8,248,061 B2 | 8/2012 | Schweitzer | |
| 8,674,683 B2 | 3/2014 | Schweitzer, III | |
| 8,725,451 B2 | 5/2014 | Whitefield | |
| 8,912,792 B2 | 12/2014 | Seeley | |
| 9,151,802 B2 | 10/2015 | Donolo | |
| 9,176,024 B2 | 11/2015 | Jensen | |
| 2002/0033052 A1 | 3/2002 | Kondo | |
| 2006/0100819 A1 | 5/2006 | Grant | |
| 2009/0089608 A1 | 4/2009 | Guzman-Casillas | |
| 2009/0091303 A1 | 4/2009 | Schweitzer, III | |
| 2010/0126274 A1 | 5/2010 | Lin | |
| 2010/0301792 A1 | 12/2010 | Tiwari | |
| 2010/0315034 A1 * | 12/2010 | Lu | H02P 23/0077 318/802 |
| 2010/0320763 A1 | 12/2010 | Li | |
| 2011/0231171 A1 | 9/2011 | Jousselin | |
| 2011/0240628 A1 | 10/2011 | Goretti | |
| 2011/0260042 A1 | 10/2011 | Schweitzer, III | |
| 2012/0313490 A1 | 12/2012 | Schweitzer, III | |
| 2013/0168960 A1 * | 7/2013 | Kalinka | H02P 11/00 290/7 |
| 2013/0314822 A1 * | 11/2013 | Dio | H02H 7/0833 361/31 |
| 2014/0018989 A1 * | 1/2014 | Kitano | H02P 5/74 701/22 |
| 2014/0055126 A1 | 2/2014 | Seeley | |
| 2014/0324389 A1 * | 10/2014 | Baldwin | G01D 9/005 702/187 |

OTHER PUBLICATIONS

GMM, Optical Pick-Up (OPU) Specifications & Hook-Up, Oct. 3, 1995.

Encoder Design Guide, Optical Encoder Design and Operation, Nov. 11, 2004.

Optical Encoder Design and Operation, Apr. 1, 2005.

Patent Cooperation Treaty, International Search Report PCT/2008/079228, dated Dec. 8, 2008.

Patent Cooperation Treaty, Written Opinion of the International Searching Authority PCT/2008/079228, dated Dec. 8, 2008.

Stephen Petronio, Optical Rotary Encoder Basics, Design News for Mechanical and Design Engineers, Apr. 22, 2002.

Zhou Jie, Zhang Daonong, Yu Yuehai, Wu Jingtao, Zhou Ji, Bi Tianshu, Xiong Ming, Rotor Position Measurement Method for Generator Power Angles, 2011 The International Conference on Advanced Power System Automation and Protection, Oct. 16, 2011.

PCT/US2013/056271, Patent Cooperation Treaty, International Search Report and Written Opinion of the International Searching Authority, dated Feb. 10, 2014.

Borim, Thiago Leite, et al., Benefits of Monitoring the Rotor Electrical Quantities and Transmitting by Wireless Communication, Presented at IEEE 2015 Petroleum and Chemical Industry Conference, Oct. 2015.

Arebi, Lufti, Gu, J., Ball, Andrew and Gu, Fengshou (2010) Investigation of a Rotating Shaft with a Novel Integrated Wireless Accelerometer. In: The Seventh International Conference on Condition Monitoring and Machinery Failure Prevention Technologies, Jun. 22-24, 2010, Ettington Chase, Stratford-upon-Avon, England, UK.

Benouzza, N., Benyettou, A., Bendiabdellah, A., An Advanced Park's Vectors Approach for Rotor Cage Diagnosis, IEEE First International Symposium on Control, Communications and Signal Processing, Mar. 21-24, 2004.

Cardoso, A.J.M., and Saraiva E.S., Computer-Aided Detection of Airgap Eccentricity in Operating Three-Phase Induction Motors by Park's Vector Approach, IEEE Transactions on Industry Applications, vol. 29, Issue 5, Sep./Oct. 1993.

Didier, G., Ternisien, E., Caspary, O., Razik H., Fault Detection of Broken Rotor Bars in Induction Motor using a Global Fault Index, IEEE Transactions on Industry Applications, vol. 42, Issue 1, Jan. 30, 2006.

Douglas, H., Pillay, P., Ziarani, A., Detection of Broken Rotor Bars in Induction Motors Using Wavelet Analysis, IEEE International Electric Machines and Drives Conference, Jun. 2003.

Stankovic, Dragen, et al., Enhanced Algorithm for Motor Rotor Broken Bar Detection, IEEE Industrial and Commercial Power Systems Technical Conference, May 9-13, 2010.

Kilman, G.B., et al, Noninvasive Detection of Broken Rotor Bars in Operating Induction Motors, IEEE Transactions on Energy Conversion, vol. 3, No. 4, Dec. 1988.

* cited by examiner

SYSTEMS AND METHODS FOR MOTOR SLIP CALCULATION USING SHAFT-MOUNTED SENSORS

RELATED APPLICATIONS

This application claims priority under 35 U.S.C. § 119 to U.S. Provisional Patent Application No. 62/395,113 filed on Sep. 15, 2016, titled "Motor Slip Calculation Using Shaft-Mounted Sensor," which application is hereby incorporated by reference in its entirety.

TECHNICAL FIELD

This disclosure relates to monitoring rotating machinery. More particularly, this disclosure relates to monitoring pole slips of a rotor or shaft in an electrical motor using a shaft-mounted sensor.

BRIEF DESCRIPTION OF THE DRAWINGS

The written disclosure herein describes illustrative embodiments that are non-limiting and non-exhaustive. Reference is made to certain of such illustrative embodiments that are depicted in the figures described below.

DETAILED DESCRIPTION

Figure 1:
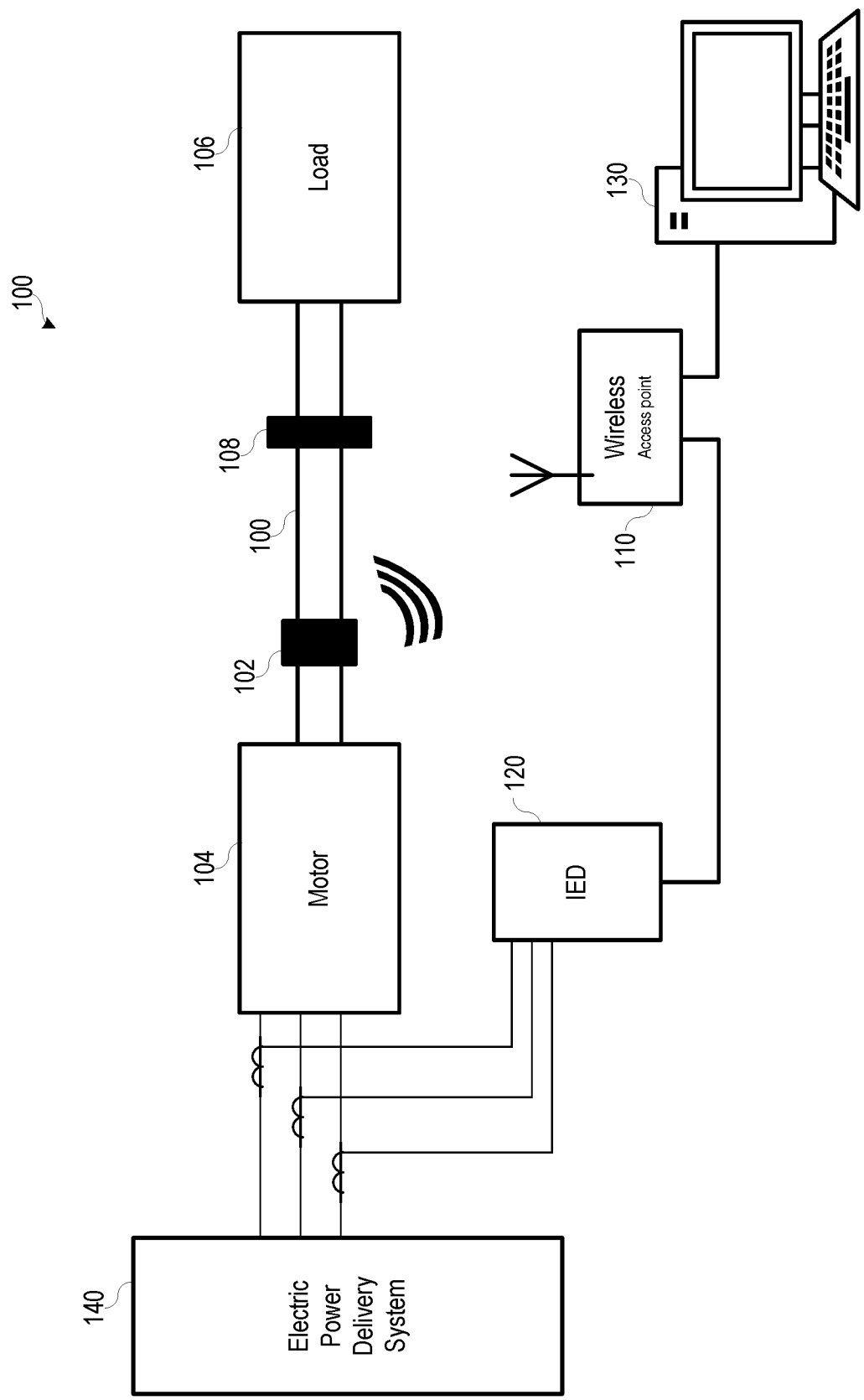
FIG. 1 illustrates a simplified block diagram of an example of a system for monitoring an electric motor.

Electric motors are used in various applications to transform electrical energy into mechanical energy. In many embodiments, an electric motor includes a stator and a rotor, generally separated by a gap. Numerous variations and configurations of motors are possible, including many variations and combinations of rotors and stators. In general, an electric current is used to generate a magnetic field that causes the rotor to rotate, and thereby provide a rotational mechanical force to a mechanical system.

The presently described systems and methods can be adapted for use with any of a wide variety of motors. However, to avoid obscuring the details of the presently described systems and methods, a motor is described and illustrated throughout that includes a stator configured to receive an electric current to generate a magnetic field that drives a rotor. In the case of an induction motor, the rotor "slips" slightly behind the frequency of the electric current driving the electromagnets. In contrast, a synchronous motor, in steady state, rotates in sync with the frequency of the electric current driving the electromagnets. The rotor may be embodied as a permanent magnet synchronous motor utilizing any of a wide variety of permanent magnets.

In some embodiments, an electric motor may be configured as a synchronous electric motor with a rotor that, in steady state, rotates synchronously with the rotating magnetic field of the stator. As previously described, the rotor may include permanent magnets or electromagnets configured such that the frequency of rotation of the rotor is synchronized with the rotation of the magnetic field of the stator. In steady state, the synchronous electric motor has no or very little "motor slip." When the rotational frequency of the rotor lags behind the rotational frequency of the magnetic field of the stator, the rotor experiences a positive slip. In some instances, where slip persists, the rotor may fall behind the magnetic field rotation of the stator and skip a pole.

Monitoring and protection devices for motors may provide slip calculations and detect pole skipping. Such devices may perform loss of synchronism (LoS) protection to monitor and protect an electric motor from damage. For example, a LoS protection device may perform motor pull out protection, during which power is disconnected from the motor and/or mechanical load is reduced. In various past applications, the electric power to the motor was monitored to identify pole skipping of the motor based on the currents, voltages, and frequencies fed to the electric motor. The present disclosure provides various systems and methods for monitoring motor slip and identifying pole skipping in an electric motor using one or more shaft-mounted sensors to monitor a shaft position relative to the stator. In some embodiments, monitoring motor slip and identifying pole skipping or pole slipping may be performed in an electric motor using both (i) electrical signals sampled from the electrical power fed to the electric motor and (ii) one or more shaft-mounted sensors to monitor a shaft position relative to the stator.

A system for monitoring loss of synchronism of an electric motor may include a sensor system, a drive frequency measurement system, and a slip calculation module. The sensor system may include a shaft-mounted sensor to measure rotational information of the rotor. The rotational information may include any of a wide variety of information to allow for the calculation of an angular speed (e.g., rotations per second) of the rotor. For instance, the shaft-mounted sensor may measure rotational acceleration of shaft using one or more shaft-mounted accelerometers. In another embodiment, the shaft-mounted sensor may comprise a radio frequency identification (RFID) tag that can be read by an RFID reader as the shaft completes revolutions. In another embodiment, the shaft may include an optical detection element that can be detected by an optical sensor as the shaft completes revolutions. In still other embodiments, a mechanical sensor system, such as a toothed-wheel sensor system, may be used to determine the angular speed of the rotor.

A system may measure the frequency of the electric current used to drive the motor, or alternatively use a known drive frequency (e.g., 50 Hz or 60 Hz). A slip calculation module, embodied as hardware, firmware, and/or software may determine a motor synchronous speed, $\omega_s$, based on the frequency value. The system may calculate a pole-adjusted rotor speed value, $\omega_{ar}$, based on a number of poles in the motor and the angular speed of the rotor as measured by the sensor system. The system may calculate a difference between the motor synchronous speed, $\omega_s$, and the pole-adjusted rotor speed value, $\omega_{ar}$, to calculate a relative speed, $\Delta\omega$, between the rotor and a rotating magnetic field of the motor.

A function of the relative speed, $\Delta\omega$, may be compared with threshold values to determine that the rotor has slipped a pole due to an over-speed condition or an under-speed condition. For example, once the motor is synchronized, the relative speed, $\Delta\omega$, may be integrated with respect to time to determine a number of poles slipped (NPS) value. If the NPS value exceeds 1, an over-speed condition may be determined. If the NPS value falls below negative one (−1), then an under-speed condition may be determined.

A wide variety of sensors, rotor monitoring devices, and IEDs may be utilized to calculate a pole-adjusted angular speed of the rotor and compare it with the frequency of the electric current driving the motor to identify a rotor slip condition. In some embodiments, a system may be installed to measure the frequency of the electric current driving the motor and the angular speed of the rotor of the motor.

In some embodiments, the integrator (embodied as hardware or as a software module within an IED) may be supervised to reduce or eliminate false slip detections. For example, the integrator may be supervised to be reset until the motor reaches synchronous speed, (ii) the motor is not in a starting condition, and/or (iii) the motor is not in a stopped condition.

The embodiments of the disclosure can be further understood by reference to the drawings, wherein like parts are designated by like numerals throughout. The components of the disclosed embodiments, as generally described and illustrated in the figures herein, could be arranged and designed in a wide variety of different configurations. Thus, the following description of the embodiments of the systems and methods of the disclosure is not intended to limit the scope of the disclosure, as claimed, but is merely representative of possible embodiments.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

One or more of the described systems and methods may be implemented, monitored, and/or controlled by an intelligent electronic device (IED). As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. An IED may include systems to monitor electric signals sampled from the electric power fed to an electric motor and/or may include portions of a sensor system to monitor a location of a shaft (rotor) within a motor (e.g. relative to the stator).

IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Aspects of certain embodiments described herein may be implemented as software modules or components. As used herein, a software module or component may include any type of computer instruction or computer-executable code located within or on a computer-readable storage medium. A software module may, for instance, comprise one or more physical or logical blocks of computer instructions, which may be organized as a routine, program, object, component, data structure, etc. that performs one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media.

Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network. In alternative embodiments, hardware and firmware may be utilized instead of software. For example, application specific control circuitry may be utilized to increase speed, efficiency, serviceability, and/or reduce maintenance costs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special-purpose processing device, such as an ASIC, PAL, PLA, PLD, CPLD, Field Programmable Gate Array (FPGA), or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

FIG. 1 illustrates a simplified block diagram of an example of a system 100 for monitoring pole slipping of an electric motor. The electric motor 104 may receive electrical power from an electric power delivery system 140. The electric motor 104 is illustrated as a three-phase electric motor. However, it is appreciated that any electric motor may be utilized. The electric motor 104 converts electrical energy from the electric power delivery system 140 into rotating mechanical energy. As illustrated, a rotor or shaft 100 of the electric motor 104 may deliver rotating mechanical energy to a mechanical load 106. The shaft 100 may include one or more mechanical couplers 108, such as gears or other mechanical coupling devices. The electric power supplied to the motor 104 may be monitored by an intelligent electronic device (IED) 120. The IED 120 may obtain current signals using current transformers (CTs), voltage signals using potential transformers (PTs), or the like.

A shaft-mounted sensor 102 may be mounted to the shaft 100. The shaft-mounted sensor 102 may provide information related to the angular position and/or speed of the shaft. In some embodiments, the shaft-mounted sensor 102 may provide a wireless signal containing rotational information to an IED or other rotor monitoring device. For example, a wireless access point 110 (e.g., Bluetooth, Wi-Fi, Zigbee, etc.) may be in wireless communication with the shaft-mounted sensor 102. The shaft-mounted sensor 102 may communicate the rotational information to the IED 120.

In some embodiments, the wireless access point 110 may be configured as part of the IED 120. In various embodiments, functions performed by the IED 120, the shaft-mounted sensor 120, and the wireless access point 110 may be combined or divided among one or more physical components. For example, some calculations may be performed by the shaft-mounted sensor system 102 prior to communicating the rotational information to the wireless access point 110 or, alternatively, directly with the IED 120.

In several embodiments, the IED 120 may receive communications from the shaft-mounted sensor 102 and calculate rotational components of the shaft 100, such as, for example, rotational speed, angular position, and/or the like. In some embodiments, the wireless access point 110 may be in communication with, or alternatively part of, a monitoring system 130. The monitoring system 130 may be a local or remote computing device, an access controller, a programmable logic controller, a Supervisory Control and Data Acquisition ("SCADA") system, or the like. The monitoring system 130 may similarly be configured to receive the signals from the shaft-mounted sensor 102 and calculate rotational components of the shaft 100. For example, the monitoring system 130 may be configured to calculate a rotational speed, angular position, and/or the like.

In FIG. 1, and in many of the other embodiments described below, a shaft-mounted sensor is used as the example approach for providing a signal related to the rotation of the shaft of a synchronous motor. However, it is appreciated that any sensor configured to provide a signal corresponding to the rotation of the shaft may be used. For instance, in one embodiment, a toothed-wheel sensor is used to determine a rotation of the shaft. A toothed-wheel sensor may include a toothed-wheel fixed to the shaft that is in mechanical communication with a sensor or monitor. The toothed-wheel may turn a corresponding gear on the sensor, which may translate the turns of the gear to turns of the shaft, and produce a signal corresponding to the rotation of the shaft. In other embodiments, the toothed-wheel may be monitored using a magnetic pickup unit configured to monitor the passing of the teeth of the toothed wheel and output a signal corresponding to the rotation of the shaft.

In yet other embodiments, and as previously described, rotation of the shaft may be monitored using an optical sensor. For example, an encoded disc or other detection feature (a bump, reflector, etc.) may be fixed to the shaft and rotate along with the shaft. A light source may be directed through the disc such that light passing through the disc is detected by a light sensor. Light passing through openings on the disc may be detected by the light sensor to produce an output signal corresponding to the rotation of the shaft. Similarly, light may be directed toward and reflected from the encoded disc. A light sensor may detect the light reflected from reflective portions of the encoded disc and used to output a signal corresponding to the rotation of the shaft.

In still other embodiments, a light (e.g., laser, ultraviolet, etc.) may be directed toward the shaft itself such that light reflected from the shaft is detected by a light sensor. A pattern of reflection due to reflective anomalies on the shaft (or markings made on the shaft) may be detected by the sensor, which may then produce an output signal corresponding to the rotation of the shaft.

In yet another embodiment, the sensor may include a proximity sensor configured to detect passing of members of the shaft. For example, a shaft coupling may include bolts, welds, or the like that protrude. The proximity sensor may be configured to output a signal upon passing of such protrusions. The signal may correspond with a rotation of the shaft.

In still further embodiments, the shaft may have one or more radio-frequency identification (RFID) tags fixed thereto. An RFID sensor may be positioned to monitor the passing of the RFID tag and output a signal corresponding with the rotation of the shaft. As provided above, these and other possible approaches and sensor systems for determining an angular speed of a rotating shaft of a motor may be used instead of and/or in addition to a shaft-mounted sensor system.

Moreover, while many of the embodiments described below are described in conjunction with synchronous motors, it is appreciated that adaptations can be made for asynchronous motors, such as induction motors. In such embodiments, a sensor system may expect some lag between the rotating magnetic field and the angular speed of the shaft. Accordingly, the angular speed of the shaft may be monitored to detect lag that exceeds a threshold amount, pole slipping, and/or a rate of increase for any of the above.

Figure 2:
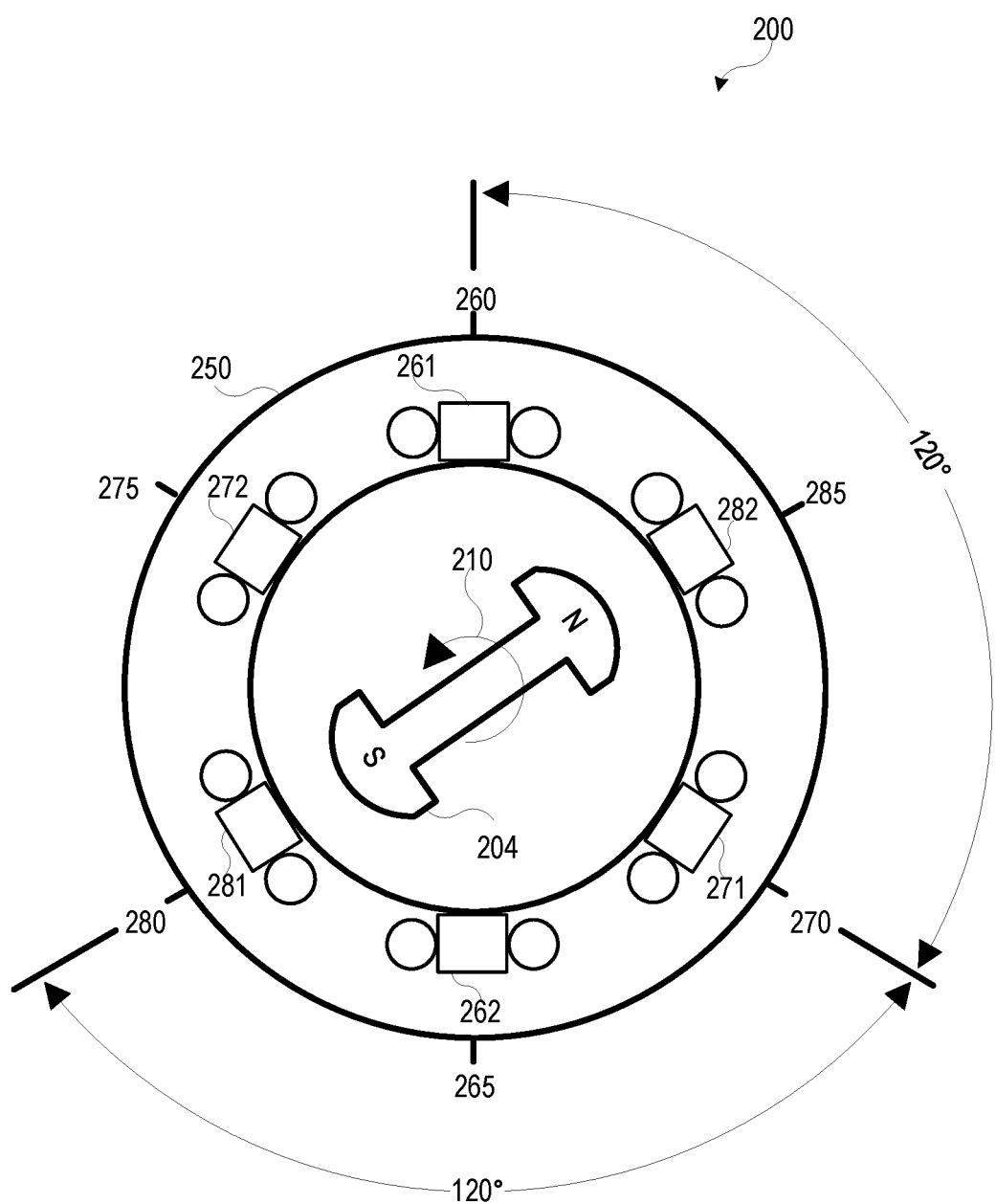
FIG. 2 illustrates a simplified block diagram of one embodiment of motor, including a rotor and a stator.

FIG. 2 illustrates a simplified block diagram of one embodiment of an electric motor 200, including a rotor 204 and a stator 250. Again, the illustrated embodiment is a three-phase motor configured to receive power from three phases of power 260/265, 270/275, and 280/285. The illustrated electric motor 200 comprises a rotor 204 that includes a north pole and a south pole. For example, the rotor may comprise electromagnetic or a permanent magnet. A rotating magnetic field from the stator 250 causes the rotor 204 to rotate in direction 210. The stator 250 comprises windings configured in three sets, each set associated with one phase of the three-phase electrical system. First set of windings 261 and 262 are connected to the first phase of power 260/265, a second set of windings 271 and 272 are connected to the second phase of power 270/275, and a third set of windings 281 and 282 are connected to the third phase of power 280/285.

Each electrical phase may provide alternating current at a drive frequency, with each phase separated by 120°. The alternating current in each phase through the windings on each pole results in a rotating magnetic field within the three pole pairs of the stator 250. The rotating magnetic field causes a rotation of the rotor 204.

Under steady-state conditions, the frequency of rotation of the rotor 204 will be synchronous with the frequency of the rotating magnetic field created by the stator 250. The rotor 204 of the illustrated three-phase motor 200 may rotate one revolution for each rotation of the magnetic field within the stator winding pairs 261/262, 271/272, and 281/282. The magnetic field created by the stator windings rotates once for each electric power system cycle. Accordingly, the rotational frequency of the rotor 204 corresponds to the electrical frequency of the electric power delivery system at steady state.

Under loaded conditions, the rotor 204 may experience a mechanical torque in a direction opposite to the rotation of the induced magnetic field, which may cause the rotor 204 to lag the rotating magnetic field. If the angular speed of the rotor 204 remains lower than the frequency of the rotating magnetic field, then the rotor 204 may fall behind the rotation of the magnetic field and eventually slip or skip to a proximate pole of the electric motor. In an extreme example, sufficient mechanical torque may be applied to the rotor 204 to stop it from rotating. With the rotor 204 stopped, the rotor would slip poles at a frequency corresponding to the frequency of the rotating magnetic field, based on the number of pole pairs in the stator 250 and the frequency of the electric current.

In various embodiments, an accurate measurement of slip in an electric motor may be performed by measuring both the frequency of the electric power fed to the motor and the angular position or frequency of the rotor. Accordingly, several embodiments herein are disclosed for measuring and comparing the angular position and/or frequency of the rotor with the frequency of the electric current driving the motor. For example, a shaft-mounted sensor may be used to determine an angular position and/or frequency of the rotor and transmit the signal to an IED configured to monitor the slip of the electric motor.

Figure 3:
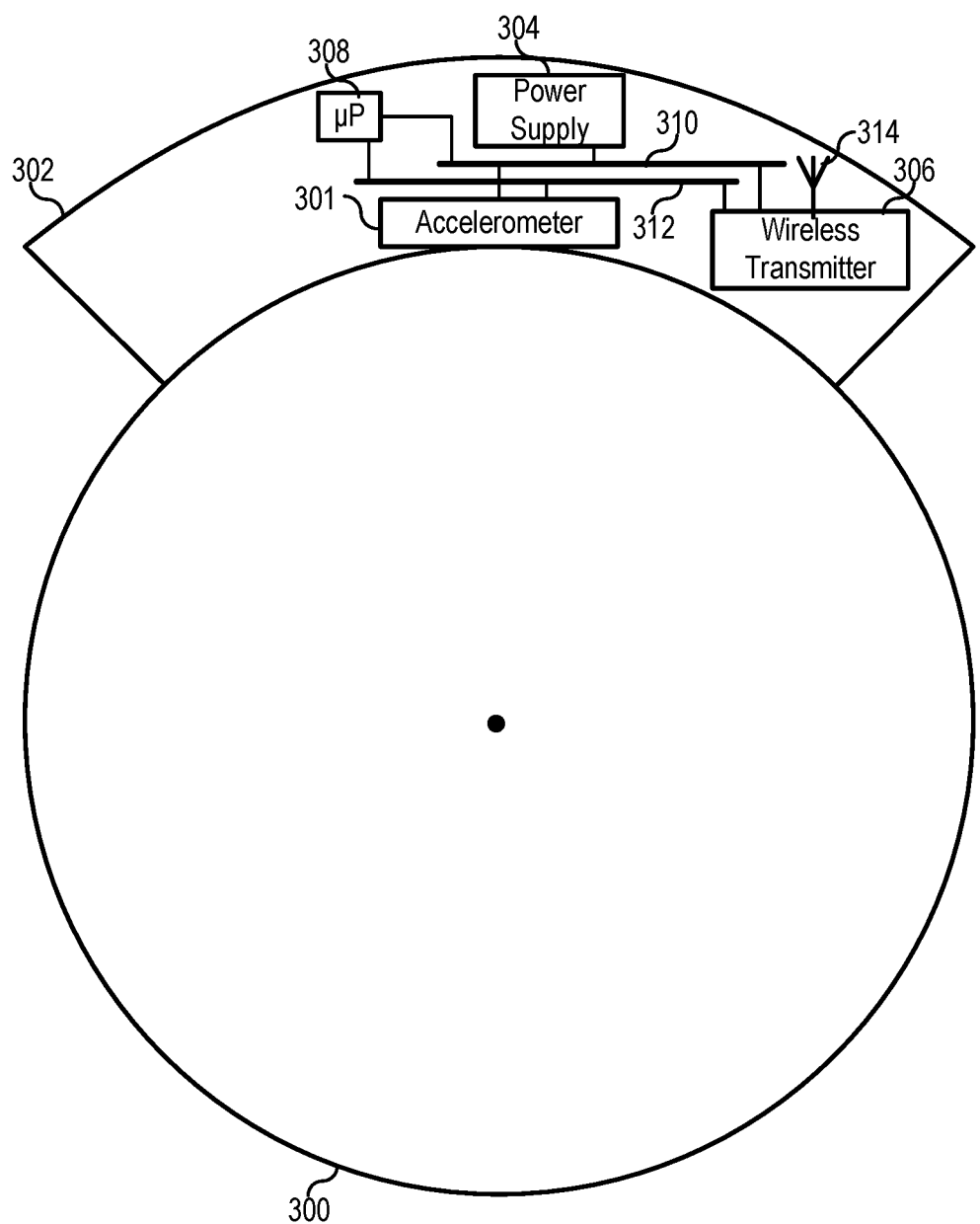
FIG. 3 illustrates a cross-sectional view of a shaft (rotor) and a simplified block diagram of an embodiment of a shaft-mounted sensor system.

FIG. 3 illustrates a cross-sectional view of a shaft (rotor) 300 and a simplified block diagram of an embodiment of a shaft-mounted sensor system 302. The shaft-mounted sensor system 302 is illustrated in exaggerated size relative to shaft 300 to more clearly illustrate the components thereof. The shaft-mounted sensor 302 may be powered by a power supply 304 in electrical communication with a power bus 310. The power supply may be powered by, for example, a battery, a piezoelectric generator, a micro-electromechanical system (MEMS) generator, or the like. The shaft-mounted sensor 302 may include an accelerometer 301, a wireless transmitter 306, and a processor 308 each in communication with a data bus 312 and receive power from the power supply 304 via the power bus 310.

The data bus may operate according to a standard such as, for example, the I2C standard. The processor 308 may be a microprocessor, FPGA, controller, ASIC, or the like. The processor 308 may include a memory component for storing computer instructions to be executed by the processor 308. In certain embodiments, the shaft-mounted sensor system 302 may also include a memory component in communication with the data bus 312 for storing computer instructions for execution by the processor 308. In certain embodiments, the memory component may be used to store information, and may be re-writeable.

The accelerometer 301 may provide a signal corresponding to the detected acceleration for use by the processor 308 and/or transmitted by the wireless transmitter 306. The processor 308 may be configured to control the accelerometer 301 and the wireless transmitter 306. The wireless transmitter 306 may be configured to transmit a signal related to the output of the accelerometer 301, communications from the processor 308, and the like. The wireless transmitter 306 may include or be in communication with an antenna device 314 for wireless transmission of the signal. The wireless transmitter 306, as has been described above, may be configured to transmit a signal according to a predetermined protocol such as, for example, Wi-Fi, Bluetooth, Zigbee, or the like.

The accelerometer 301 may operate according to piezoelectric, piezoresistive, capacitive principles or the like, including combinations thereof. The accelerometer 301 may additionally or alternatively include a MEMS accelerometer. The shaft-mounted sensor 302 may be mounted to the shaft 300 using one or more of various attachment means. In one embodiment, the shaft-mounted sensor 302 may be fixed to the shaft 300 using an adhesive between the shaft 300 and the shaft-mounted sensor 302. In another embodiment, the shaft-mounted sensor 302 may be fixed to the shaft 300 using a mechanical clamping mechanism. In other embodiments, the shaft-mounted sensor 302 may be fixed to the shaft 300 using more than one mounting techniques such as an adhesive and a mechanical clamping mechanism. In still other embodiments, the shaft-mounted sensor system 302 may be embedded within the shaft 300.

The shaft-mounted sensor system 302 may provide rotational information based on the acceleration, or associated signal, measured by the accelerometer 301. Such a signal may be used by an IED or a monitoring system to calculate a rotational speed and/or angular position of the shaft as described herein. In other embodiments, the processor 308 may use the signal from the accelerometer to calculate a rotational speed and/or angular position of the shaft as described herein. In such embodiments, the processor 308 may be pre-set or programmable with the radius of the shaft 300. The processor 308 may transmit the calculated rotational speed and/or angular position using the wireless transmitter 306.

In still other embodiments, the processor 308 may be configured to compare the calculated rotational speed with a predetermined threshold. The processor 308 may be pre-set or programmable with the predetermined threshold. In such embodiments, the processor 308 may be configured to cause the wireless transmitter 306 to transmit a message when the predetermined threshold is crossed. In one particular embodiment, the shaft-mounted sensor system 302 may be configured to transmit a speed sensor message once the calculated rotational speed reaches a predetermined threshold (above or below a threshold). The IED or other monitoring system may interrupt operation of the rotating machinery if the speed switch message is not received within a predetermined time from starting the rotating machinery. In other embodiments, the threshold may be set above a nominal operating condition of the rotating machinery. The processor 308 may cause the wireless transmitter to transmit a message indicating that the rotational speed of the shaft 300 has exceeded the threshold. The IED or other monitoring system may use such message in protection and monitoring of the rotating machinery.

Figure 4:
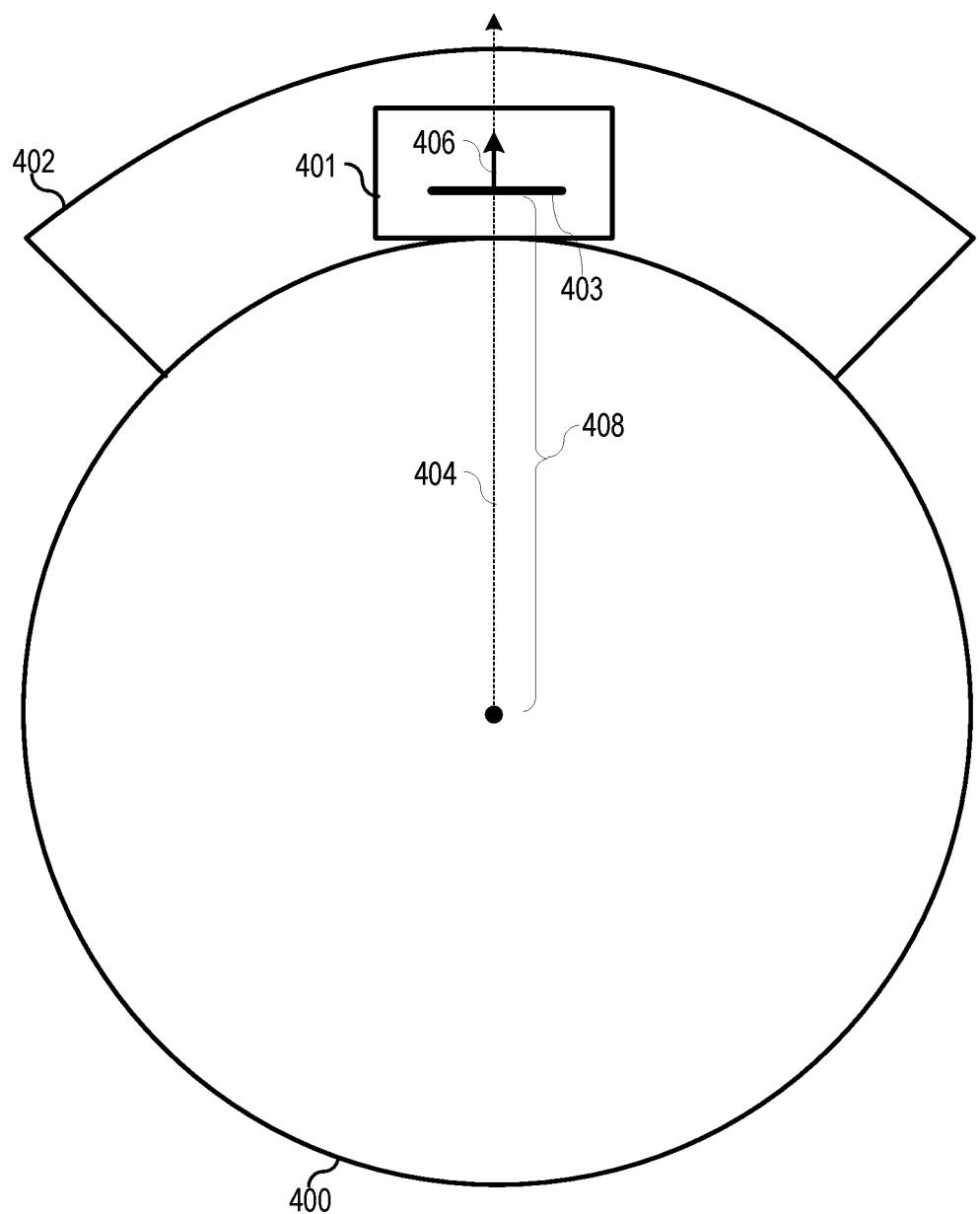
FIG. 4 illustrates a cross-sectional view of a shaft and a simplified block diagram of an embodiment of a shaft-mounted sensor system.

FIG. 4 illustrates a cross-sectional view of a shaft (rotor) 400 and a simplified block diagram of an embodiment of a shaft-mounted sensor system 402 (again, proportionally enlarged for clarity). The accelerometer 401 includes a sensing component 403 fixed a known distance 408 from the center of the shaft 400. In some embodiments, the sensing component 403 of the accelerometer 401 may determine an acceleration along an axis 406 of detection. In one embodiment, the accelerometer 401 is fixed to the shaft 400 such that the axis of detection 406 is collinear with a radius 404 of the shaft.

Accordingly, the acceleration measured by the accelerometer 401 may be radial acceleration proportional to the rotational speed of the shaft 400, based on the distance 408 of the sensing component 403 from the center of the shaft 400. Equations 1-3, below, may be used to calculate the rotational speed of the shaft 400.

$$\text{RPM} = \frac{60}{2\pi}\sqrt{\frac{a}{r}} \quad \text{Equation 1}$$

$$\text{rev/s} = \frac{1}{2\pi}\sqrt{\frac{a}{r}} \quad \text{Equation 2}$$

$$\text{rad/s} = \sqrt{\frac{a}{r}} \quad \text{Equation 3}$$

In Equations 1-3 above, RPM stands for rotations per minute, a is the acceleration measured in meters-per-second-per-second (m/s$^2$), r is the distance from the center of the shaft to the sensing component in meters, rev/s is revolutions per second, and rad/s is radians per second.

In embodiments in which the shaft 400 is mounted vertically, the measured acceleration may be attributed to rotation of the shaft 400. However, in embodiments in which the shaft 400 is not mounted vertically, the measured acceleration may include acceleration components caused by Earth's gravity. In such embodiments, the measured acceleration may be adjusted by the known quantities.

Figure 5A:
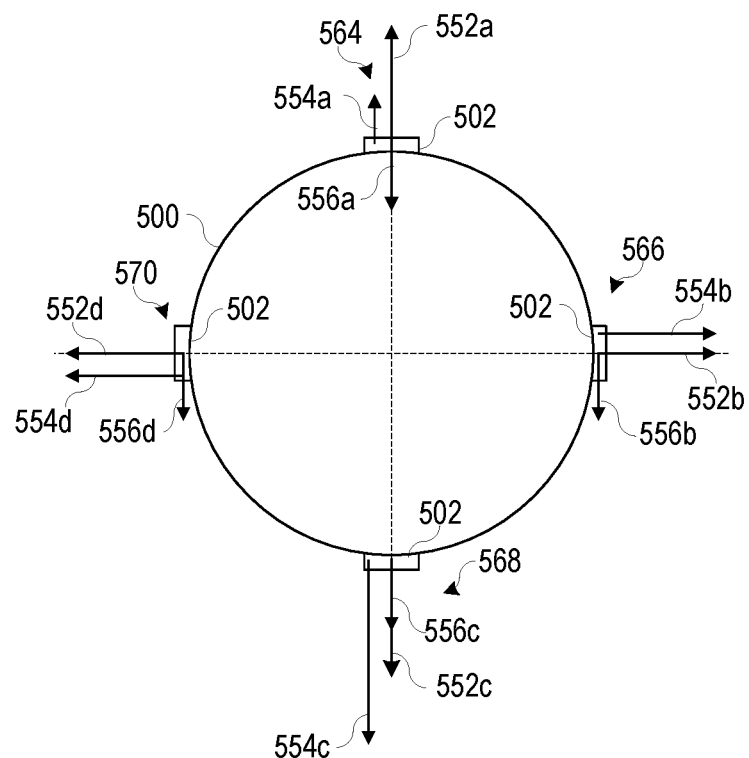
FIG. 5A illustrates simplified diagrams of a cross-sectional view of a shaft and associated shaft-mounted sensor system at various angular positions.

FIG. 5A illustrates simplified diagrams of a cross-sectional view of a shaft 500 at four instants in time shown by sub-reference letters a, b, c, and d.

Figure 5B:
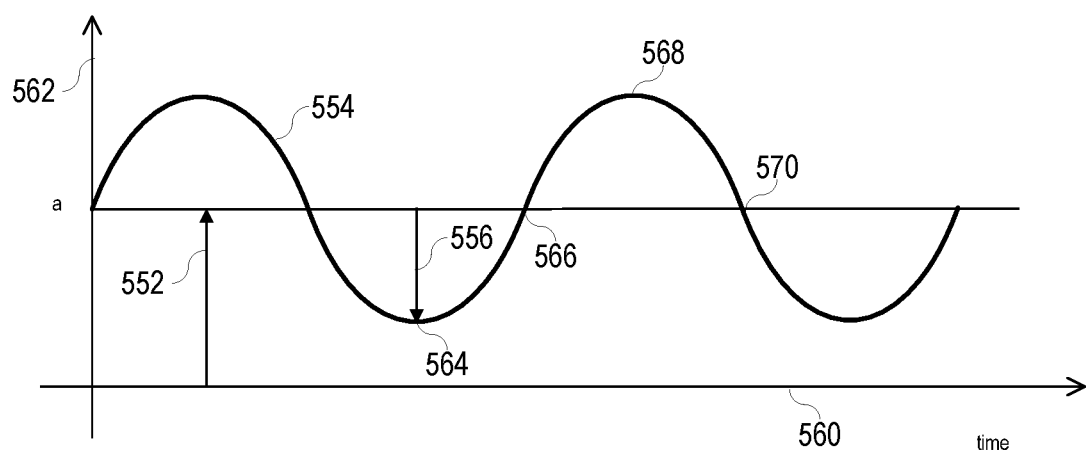
FIG. 5B illustrates a plot of the acceleration measured by the shaft-mounted sensor system at the various angular positions.

FIG. 5B illustrates a plot of the measured acceleration over time during two rotations of the shaft 500. In a first position 564, an accelerometer of the shaft-mounted sensor system 502 is shown at the top of the shaft 500. In this first position 564, the accelerometer of the shaft-mounted sensor system 502 will output a measured acceleration 554a which is a sum of the radial component of acceleration due to gravity 556a and a radial acceleration 552a due to the rotation of the shaft 500. Subsequently at position 566, the accelerometer of the shaft-mounted sensor system 502 will output a measured acceleration 554b which is a sum of the radial component of the acceleration due to gravity 556b and a radial acceleration 552b due to the rotation of the shaft 500. Similarly, at position 568, the accelerometer of the shaft-mounted sensor system 502 will output a measured acceleration 554c which is a sum of the radial component of the acceleration due to gravity 556c and a radial acceleration 552c due to the rotation of the shaft 100. Finally, as illustrated at position 570, the accelerometer of the shaft-mounted sensor system 502 will output a measured acceleration 554d which is a sum of the radial component of acceleration due to gravity 556d and a radial acceleration 552d due to the rotation of the shaft 500.

In embodiments in which a single-axis accelerometer is used, the acceleration due to gravity in the radial direction at positions 566 and 570 is zero. Thus, at positions 566 and 570, the measured acceleration is the acceleration due to the rotation of the shaft. At positions 564 and 568, however, the measured acceleration is the sum of the acceleration due to gravity and the acceleration due to the rotation of the shaft 500.

FIG. 5B illustrates a plot of acceleration 562 over time 560 at the various positions 564, 566, 568, and 570 in FIG. 5A. The measured acceleration 554 at position 564 is the sum of the acceleration due to gravity 556 and the acceleration 552 due to the rotation of the shaft. At positions 566 and 570, the measured acceleration 554 is due only to the acceleration 552 of the shaft. At position 568, the measured acceleration 554 is due to the sum of the acceleration due to gravity 556 and the acceleration 552 due to the rotation of the shaft.

In the embodiment described above, a single-axis accelerometer is used with an axis aligned with the radial axis of the shaft 500. In an alternative embodiment, a multi-axis accelerometer may be used. Using a multi-axis accelerometer may result in additional acceleration components being measured, but they may be mathematically cancelled out to determine the acceleration component specifically associated with the rotation of the shaft 500. In some embodiments, more than one shaft-mounted sensor system 502, each comprising a multi-axis accelerometer, may be used. Captured data may be used to mathematically cancel out acceleration caused by movement of the motor, jitter, vibrations, rotor wobble, etc.

Regardless of the number of shaft-mounted sensor systems 502 and/or the number of axis each accelerometer has (or the number of single-axis accelerometers used), the data may be used to calculate the rotational speed of the shaft 500.

In embodiments in which gravity, wobble, movement, shake, or other factors introduce additional acceleration components, the simplistic equations in presented in Equations 1-3 may not be used without some compensation. In the case of the gravitational component, the wave 554 has an offset. The offset is the acceleration due to the rotation of the shaft 500. In some embodiments, an average of the measured acceleration over a predetermined time may be used as the acceleration in Equations 1-3 to determine the rotational speed of the shaft 500. In several embodiments, the average of the measured acceleration may be determined using a low-pass filter on the measured acceleration.

In some embodiments, the rotational speed of the shaft 500 may be calculated using a period of the periodic waveform from the measured acceleration 554. A time between positive peaks (or negative peaks) may be measured to determine a period of the periodic waveform. The inverse of the period is a frequency of the periodic waveform, and hence a frequency of the shaft in revolutions per second. Such frequency can be used to determine the rotational speed in the desired units such as, for example, revolutions per second, revolutions per minute, radians per second, or the like.

Figure 6A:
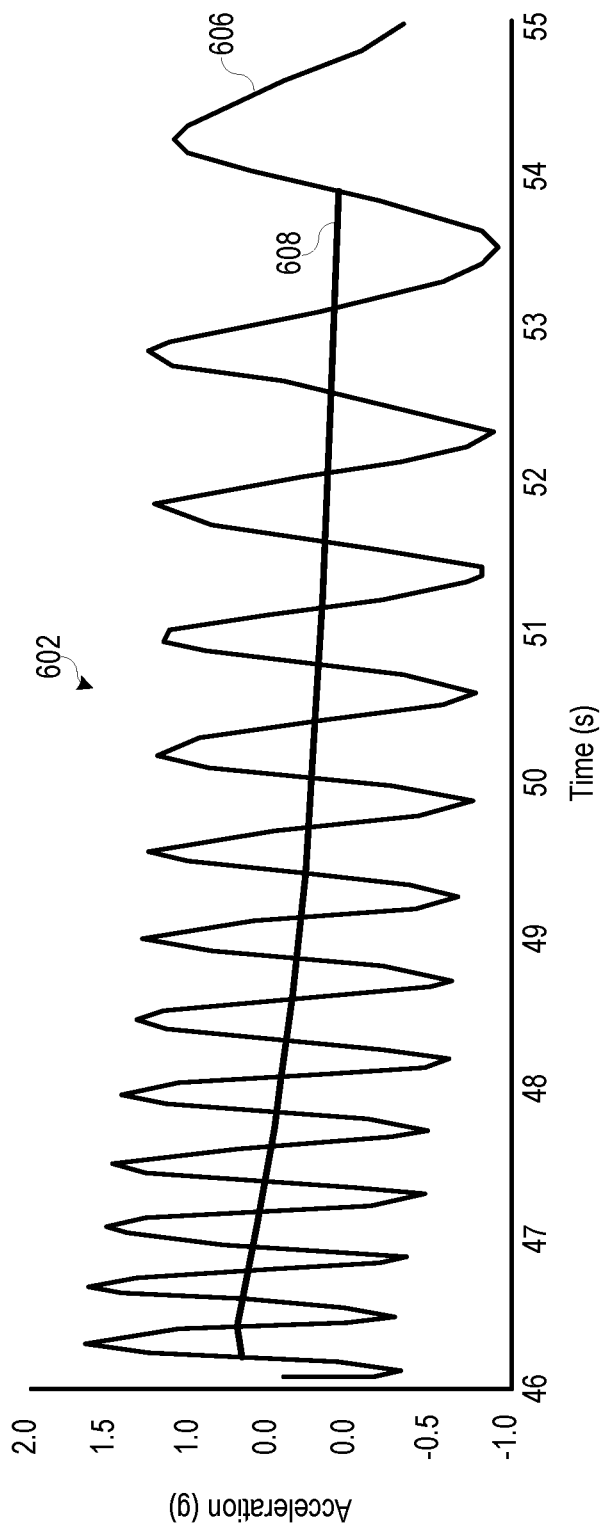
FIG. 6A illustrates a plot of rotational acceleration over time, as measured by a shaft-mounted sensor system.

FIG. 6A illustrates a plot 602 of rotational acceleration over time, as measured by a shaft-mounted sensor system. Plot 602 illustrates the measured acceleration 606 as the shaft slows, as well as a calculated average 608 acceleration as the shaft slows.

Figure 6B:
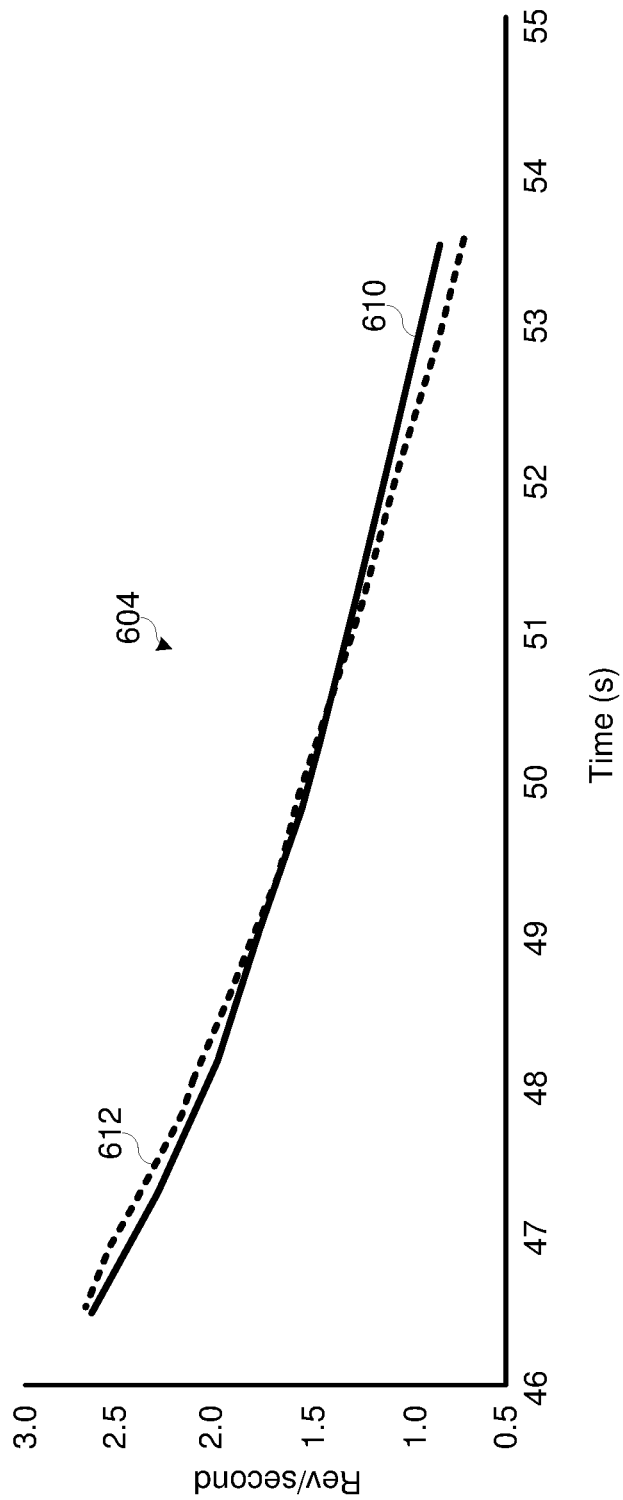
FIG. 6B illustrates a plot of the number of revolutions per second with respect to time, as measured by a shaft-mounted sensor system.

FIG. 6B illustrates a plot 604 of the number of revolutions per second over time, as measured by a shaft-mounted sensor system. Trace 612 illustrates the rotational speed calculated using a determined period from peak values of the measured acceleration 554 (in FIG. 5A). Trace 610 uses the average of the measured acceleration 606 (from FIG. 6A) as the acceleration in Equation 2.

In embodiments where the shaft is configured with its axis horizontal, the acceleration due to gravity will be −1 g, and the amplitude of the waveform of the measured acceleration 554 will be 1 g. For example, the amplitude of the measured acceleration 606 in FIG. 6A is close to 1 g, indicating that the axis of the shaft is horizontal. In embodiments where the shaft is configured with its axis in orientations approaching vertical, the acceleration due to gravity in the radial direction with respect to the shaft will approach zero, and the amplitude of the waveform of the measured acceleration 554 will approach zero.

In embodiments where the measured acceleration includes a component due to the acceleration of gravity such as where the shaft is in a non-vertical orientation, an angular position of the shaft may be calculated. That is, where the shaft is configured with its axis not in the vertical, the measured acceleration will be a periodic waveform with an offset related to the rotational speed of the shaft, an amplitude related to the orientation of the shaft from horizontal to vertical, and a periodicity that can be used to calculate an angular position of the shaft. For example, a difference between the measured acceleration and the average acceleration can be normalized by the amplitude of the waveform, and used to calculate the angular position in radians or degrees. Such calculation may be expressed as Equation 4:

$$\propto\ =\sin^{-1}\left(\frac{a_m-a_v}{A}\right) \quad \text{Equation 4}$$

In Equation 4 above, $\propto$ is an angular position of the shaft, $a_m$ is the measured acceleration, $a_v$ is the average acceleration, and A is the amplitude of the waveform (1 g for horizontally-mounted shafts).

Figure 7:
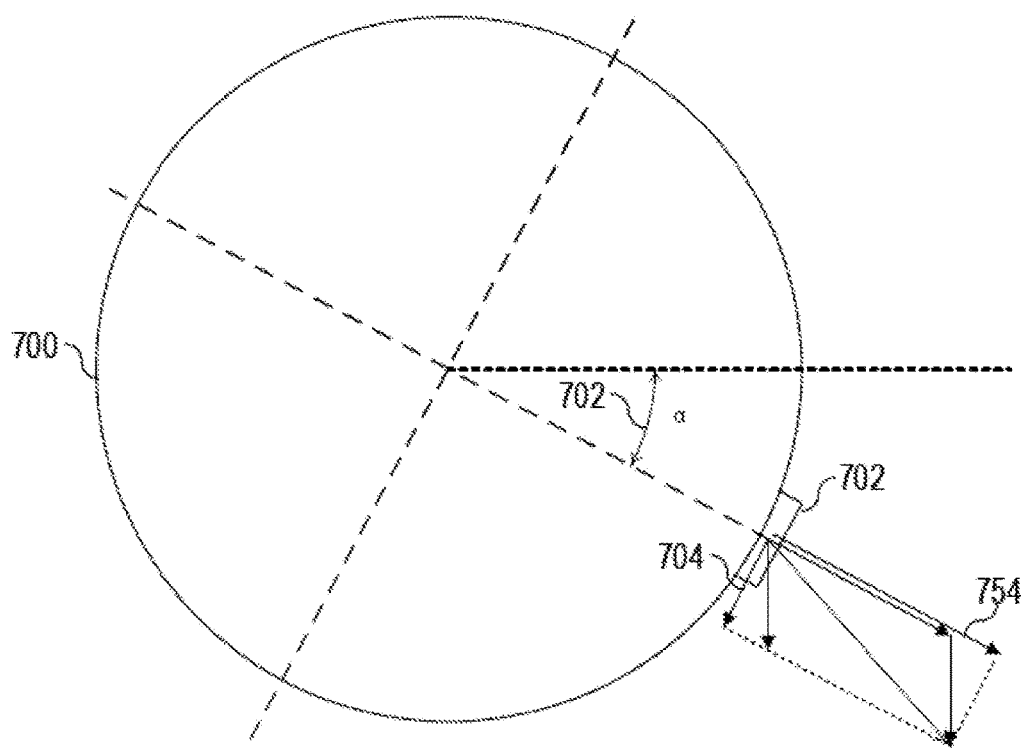
FIG. 7 illustrates a cross-sectional view of a shaft and a shaft-mounted sensor system with a multi-axis accelerometer.
Figure 7:
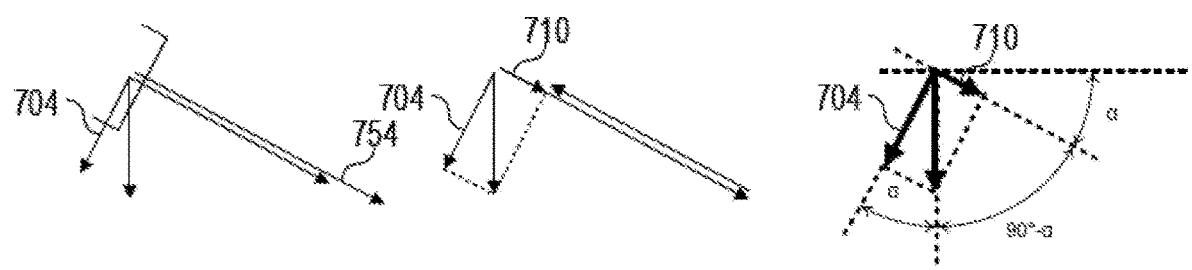

FIG. 7 illustrates a cross-sectional view of a shaft 700 and a shaft-mounted sensor system 702 with a multi-axis accelerometer. The multi-axis accelerometer of the shaft-mounted sensor system 702 may include two axes of sensing. The accelerometer may alternatively be a three-axis accelerometer. The accelerometer may be fixed to the shaft 700 such that one axis of sensing is collinear with a radius of the shaft 700, and another axis of sensing in a direction tangential to the shaft 700. In alternative embodiments, components of a three-axis accelerometer may be mathematically manipulated to determined acceleration components that are (i) collinear with a radius of the shaft and (ii) tangential to the shaft 700.

The accelerometer of the shaft-mounted sensor system 702 may measure a tangential acceleration 704 and a radial acceleration 754. A rotational speed of the shaft 700 may be calculated using the measured radial acceleration 754, according to several embodiments described herein.

The angular position of the shaft 700 may be calculated during operation and at standstill using the measured tangential acceleration 704 and measured radial acceleration 754. The angular position a of the shaft can be calculated using the measured tangential acceleration 704 and a difference 710 between the measured radial acceleration 754 and the radial acceleration due to the rotation of the shaft, which may be approximated using an average radial acceleration. As discussed above, any of several methods may be used to calculate the average radial acceleration such as, for example, use of a low-pass filter. The angular position a of the shaft 700 may be calculated as:

$$\propto\ =\tan^{-1}\left(\frac{Mx}{Mt}\right) \quad \text{Equation 5}$$

In Equation 5 above, $\propto$ is an angular position of the shaft, Mx is the measured radial acceleration (Mr)—the acceleration due to shaft rotation, Mt is the measured tangential acceleration.

Figure 8A:
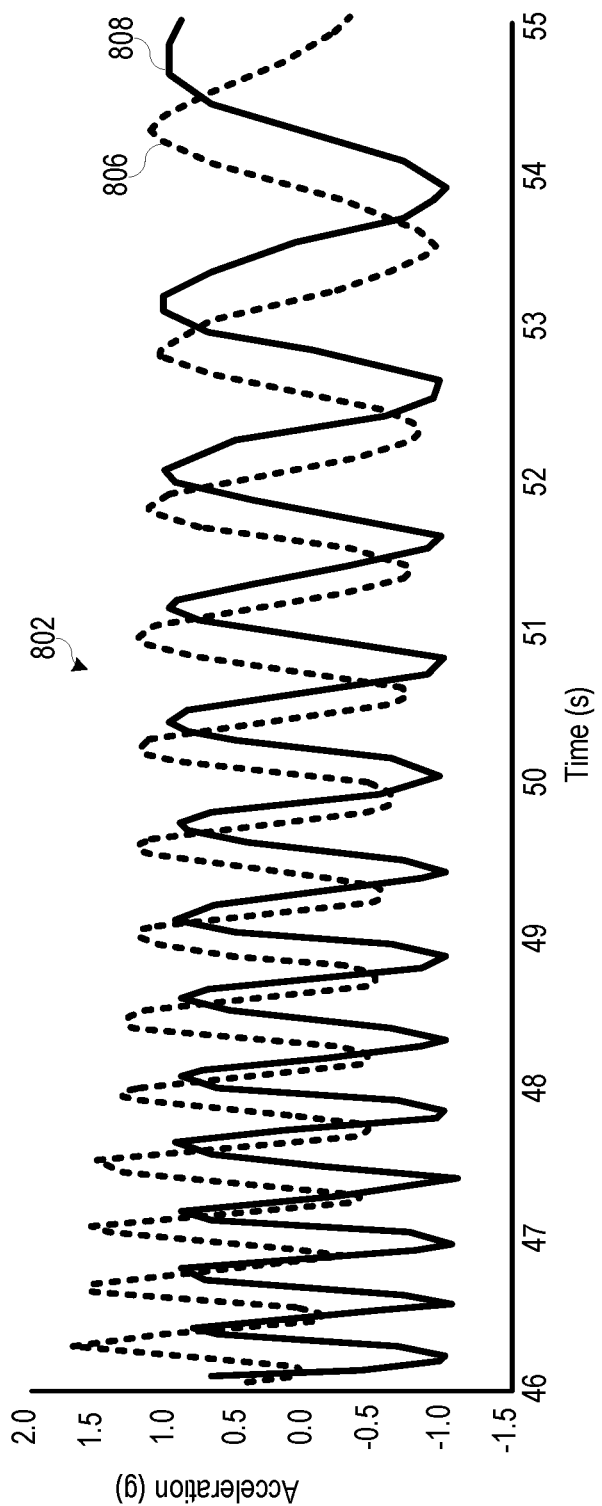
FIG. 8A illustrates a plot of the rotational acceleration over time, as measured by a shaft-mounted sensor system with a multi-axis accelerometer.

FIG. 8A illustrates a plot 802 of the rotational acceleration over time, as measured by a shaft-mounted sensor system with a multi-axis accelerometer. In the illustrated embodiments, trace 806 represents the measured radial acceleration and trace 808 represents the measured tangential acceleration.

Figure 8B:
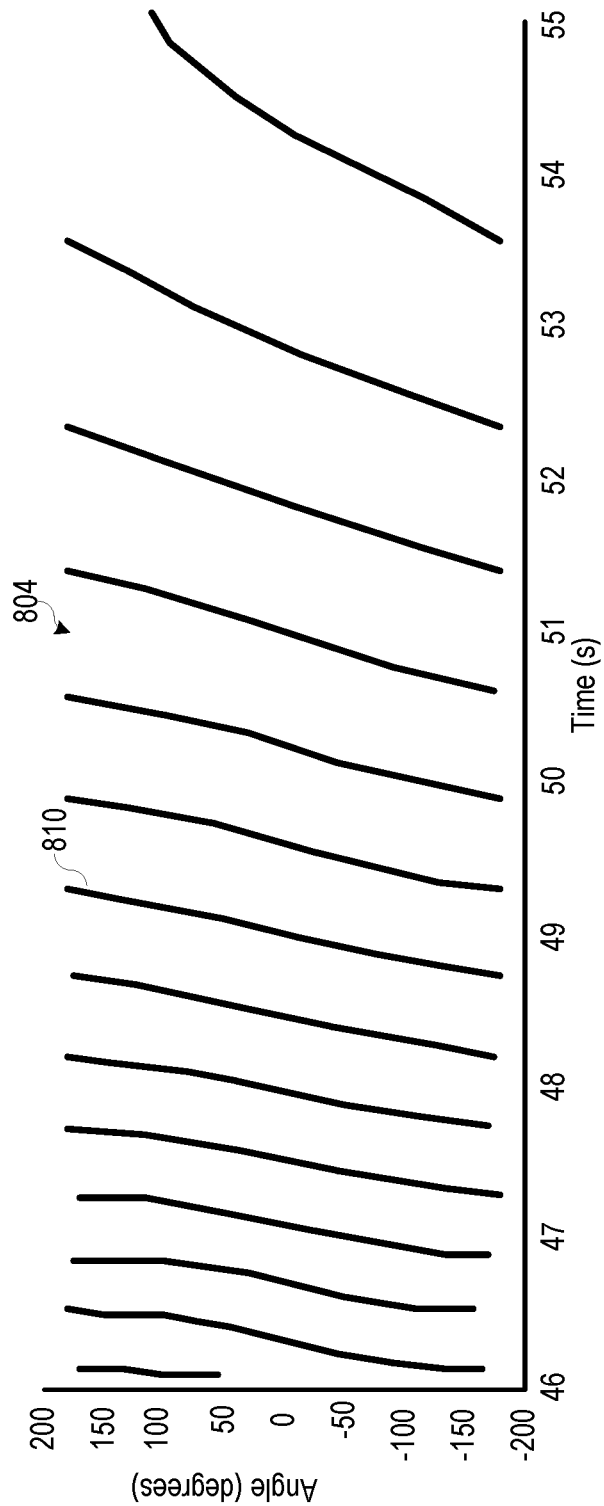
FIG. 8B illustrates a plot of the angular position of the shaft over time, as measured by a shaft-mounted sensor system with a multi-axis accelerometer.

FIG. 8B illustrates the acceleration and angle of the shaft as the shaft slows. The angular position of the shaft is calculated and shown in plot 804 as trace 810 in degrees with respect to time.

In some embodiments, the angular position of the shaft may be used to calculate the rotational speed of the shaft. The angular position of the shaft may be calculated according to various embodiments described herein. To calculate the rotational speed of the shaft, the difference in angular position with respect to time may be calculated using, for example:

$$S=\frac{d\propto}{dt} \quad \text{Equation 6}$$

In Equation 6 above, $\propto$ is an angular position of the shaft and S is the rotational speed of the shaft.

In one embodiment, the processor of the shaft-mounted sensor calculates the rotational speed of the shaft using the angular position of the shaft. In other embodiments, an IED may be configured to calculate the rotational speed of the shaft based on the angular position of the shaft.

Figure 9:
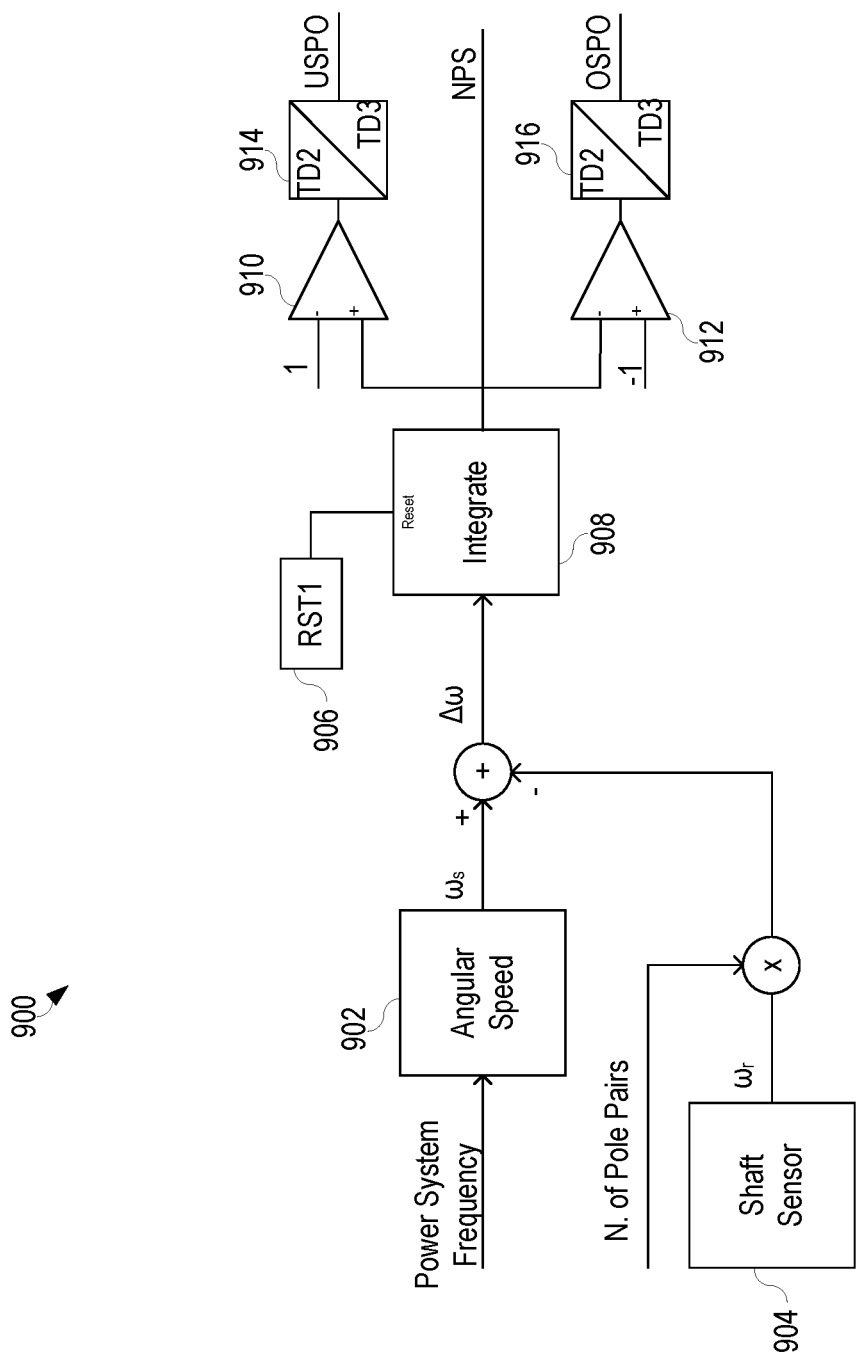
FIG. 9 illustrates an embodiment of a logic diagram of a system for monitoring an electric motor.

FIG. 9 illustrates an embodiment of a logic diagram of a system 900 for monitoring pole slipping of an electric motor. Many, or even all, of the functions illustrated in system 900 may be implemented as electronic circuit components or as hardware, firmware, or software modules or components in an IED (such as the IED in FIG. 1. The system 900 may obtain current and/or voltage signals from an electric power system used to drive a motor. A frequency of the electric power may be calculated, for example, based on times between electric signal peaks, times between zero-crossings of the signal, or the like. Power system frequency may alternatively be assumed to be 50 Hz or 60 Hz in a known system. Power system frequency may additionally or alternatively be estimated using a rotation of calculated positive-sequence phasor. Any of a wide variety of frequency calculation or estimation approaches may be utilized.

As illustrated, an angular speed may be calculated, in block 902, as a motor synchronous speed $\omega_s$ (or angular speed) based on the power system frequency. The rotor angular speed, $\omega_r$, either provided by a shaft sensor 904 or calculated from the transmissions from the shaft sensor 904 is multiplied by the number of pole pairs of the electric motor to obtain a pole-adjusted angular speed, $\omega_{ar}$, which result is subtracted from the motor synchronous speed, $\omega_s$, to yield a motor relative frequency $\Delta\omega$. The motor relative frequency $\Delta\omega$ is integrated over time 908 to yield the number of skipped poles (NPS).

When the NPS exceeds an under-speed pull-out (USPO) threshold 910 (for example, 1), for a predetermined time 914, then a USPO condition is detected. A USPO condition results from the frequency of the rotor lagging the frequency of the rotating electric field of the stator for a sufficient period of time to slip behind a predetermined number of poles. If the NPS is below an over-speed pull-out (OSPO) threshold 912 (for example, −1) for a predetermined time 916, then an OSPO condition is detected.

When the motor enters synchronous operation, the integrator 908 may be reset by a reset signal 906. Synchronous conditions may be determined when the motor relative frequency $\Delta\omega$ is below a predetermined threshold after, for example, a startup sequence of the motor.

In various embodiments, the USPO and the OSPO condition signals may be connected to an IED configured to perform one or more control, reporting, protection, or monitoring functions. The USPO and/or OSPO signals may be used alone or in combination with other system measurements to identify a loss of synchronism condition and potentially perform a protective action to protect mechanical system connected to the motor and/or the motor itself. For example, the IED may be configured to remove the motor from service by, for example, tripping a breaker or opening a switch, removing electric power from the motor, reducing electric power to the motor, increasing electric power to the motor, removing all or some of the mechanical load, etc.

Figure 10A:
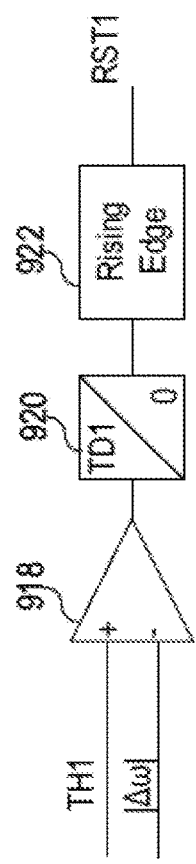
FIG. 10A illustrates an embodiment of a logic diagram for a reset signal of the logic diagram in FIG. 9.

FIG. 10A illustrates an example of a reset signal for the integrator 908. As illustrated, a predetermined synchronism threshold TH1 may be compared against an absolute value of the motor relative frequency $\Delta\omega$ in comparator 918. If the absolute value of the motor relative frequency $\Delta\omega$ exceeds the synchronism threshold for a predetermined time 920, then a rising edge 922 reset signal may be provided. To the integrator 908 in FIG. 9. The reset signal 906 in FIG. 9 may be provided to the integrator 908 when either the rising edge 922 signal is provided.

Figure 10B:
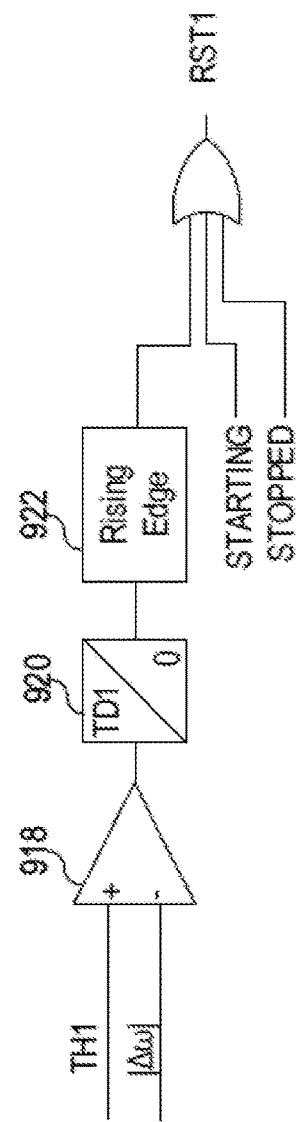
FIG. 10B illustrates a supervised embodiment of a logic diagram for a reset signal of the logic diagram in FIG. 9.

FIG. 10B illustrates an alternative reset signal 906 that is based on an OR condition of a startup signal being sent, a stopped signal being sent, or the motor reaching synchronous conditions as described in conjunction with FIG. 10A. In such embodiments, the OR gate may operate to ensure that the integrator 908 in FIG. 9 is continually reset until the motor is synchronized, and the motor is not in a startup mode, and the motor is not in a stopped state.

Figure 11:
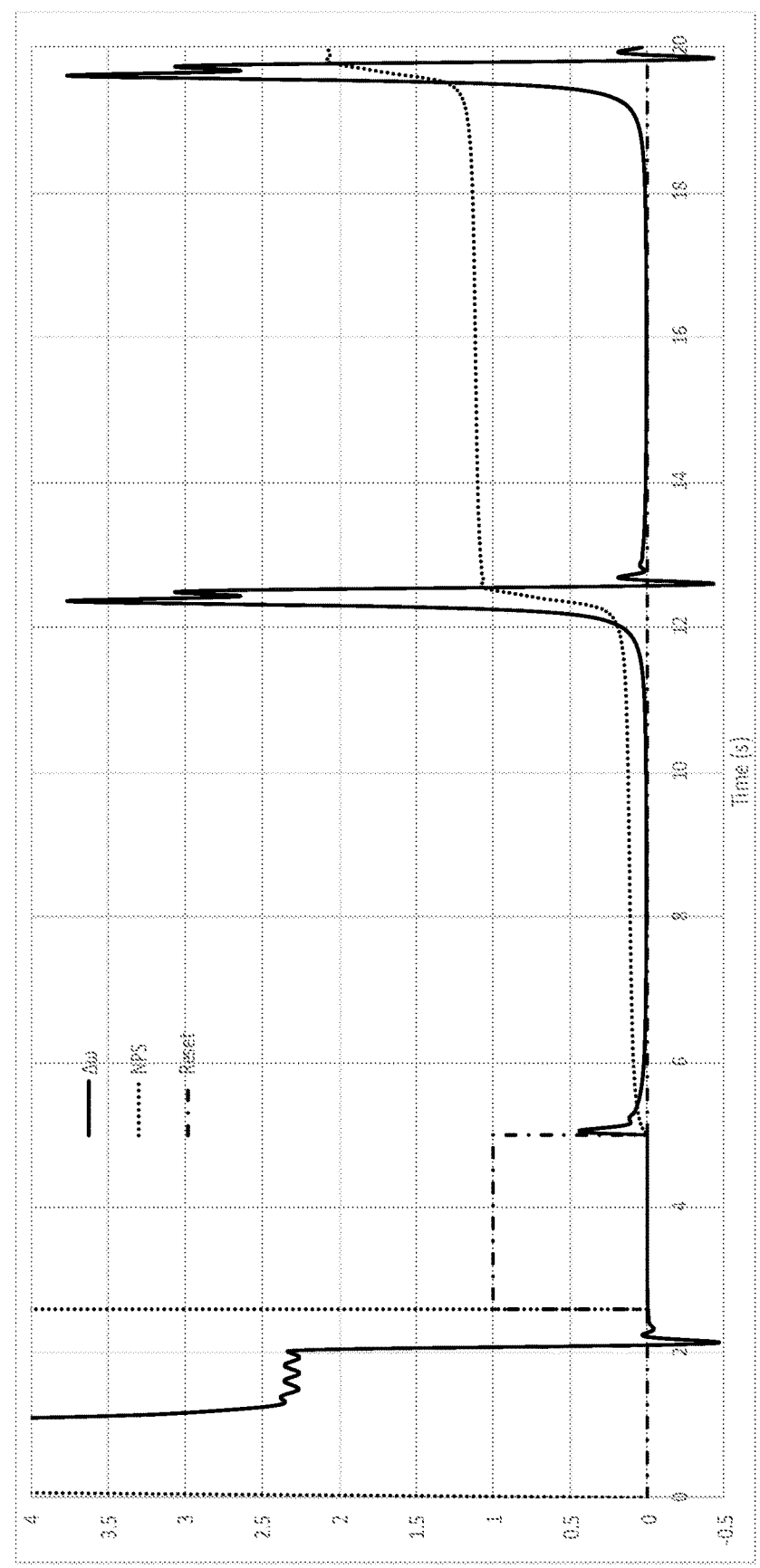
FIG. 11 illustrates a plot of a pole slip of an electric motor detected using a shaft-mounted sensor system.

FIG. 11 illustrates a plot 1100 of a pole slip of an electric motor detected using a shaft-mounted sensor system, according to various embodiments. The plot illustrates that during the start of a motor, from time 0 to time 2, the motor relative frequency $\Delta\omega$ is high, resulting in the NPS being high until around time 2.25, when the Reset (per, for example, FIG. 10A) is initiated due to the motor relative frequency $\Delta\omega$ persisting below the predetermined threshold for a predetermined time. Due to the assertion of the reset until around time 5, the NPS remains at zero. At around time 5, the motor relative frequency $\Delta\omega$ rises, resulting in an increase in the NPS.

At around time 11, the motor relative frequency $\Delta\omega$ rises sharply, resulting in an increase in NPS that exceeds one. The offset again rises at around time 18, resulting in the NPS exceeding two.

Accordingly, the signals from the shaft-mounted sensor may be used by the IED along with signals from the electric power fed to the motor to monitor the electric motor for loss of synchronism. As discussed above, the IED may perform protection functions based on the determined loss of synchronism.

While specific embodiments and applications of the disclosure are described above, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified and/or steps or actions may be omitted.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations. Thus, all feasible permutations and combinations of embodiments are contemplated. It is also appreciated that while synchronous motors are generally described, various adaptations of the described embodiments can be utilized to monitor and/or protect an asynchronous motor. Similarly, adaptations of the shaft-mounted sensor systems can be made to monitor and/or protect a stator and rotor combination being used as a generator (i.e., where mechanical force is being used to rotate the rotor to generate an electric current in the stator).

Several aspects of the embodiments described may be implemented, controlled, and/or monitored using software modules or components. As used herein, a software module or component may include any type of computer instruction or computer executable code located within a memory device and/or transmitted as transitory or non-transitory electronic signals over a system bus or wired or wireless network.

In the description above, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims are hereby expressly incorporated into this Detailed Description, with each claim standing on its own as a separate embodiment. This disclosure includes all permutations and combinations of the independent claims with their dependent claims.

It will be apparent to those having skill in the art that changes may be made to the details of the above-described embodiments without departing from the underlying principles of the invention. Embodiments of the invention in which an exclusive property or privilege is claimed are defined as follows:

What is claimed is:

1. A system for monitoring loss of synchronism of an electric motor, comprising:

a rotor monitoring device to obtain rotational information of a rotor of a motor;

a frequency measurement device to measure a frequency value of power driving the motor; and an intelligent electronic device (IED) to:

receive the rotational information from the rotor monitoring device;

receive the frequency value of the power driving the motor;

determine a motor synchronous speed, $\omega_s$, based on the frequency value;

calculate a pole-adjusted rotor speed value, $\omega_{ar}$, based on a number of poles in the motor;

calculate a relative speed, $\Delta\omega$, between the rotor and a rotating magnetic field of the motor, based on a difference between the motor synchronous speed, $\omega_s$, and the pole-adjusted rotor speed value, $\omega_{ar}$;

determine a number of poles slipped (NPS) value based on a function of the relative speed, $\Delta\omega$; and detect that a pole has slipped when the NPS value is outside of a threshold range.

2. The system of claim 1, further comprising a shaft-mounted sensor to communicate the rotational information of the rotor of the motor to the rotor monitoring device.

3. The system of claim 1, further comprising:

a sensor to communicate rotational information of the rotor of the motor, wherein the sensor is physically mounted proximate the rotor of the motor.

4. The system of claim 1, wherein the rotor monitoring device is incorporated in the IED.

5. The system of claim 3, wherein the sensor comprises an optical sensor to measure rotations of the rotor.

6. The system of claim 3, wherein the sensor comprises a radio frequency (RF) sensor configured to measure rotations of a shaft-mounted RF transmitter.

7. The system of claim 3, wherein the sensor comprises a shaft-mounted sensor that is physically mounted to the rotor of the motor.

8. The system of claim 7, wherein the sensor comprises at least one accelerometer to measure an acceleration due to rotation of the rotor.

9. A method for detecting a loss of synchronism of an electric motor, comprising:

determining a motor synchronous speed, $\omega_s$, based on a frequency of power driving a motor;

determining, via a rotor-speed sensor system, an angular speed value, $\omega_r$, of a rotor of the motor;

calculating a pole-adjusted rotor speed value, $\omega_{ar}$, based on a number of poles in the motor;

calculating a relative speed, $\Delta\omega$, between the rotor and a rotating magnetic field based on a difference between the motor synchronous speed, $\omega_s$, and the pole-adjusted rotor speed value, $\omega_{ar}$;

determining a function of the relative speed, $\Delta\omega$, with respect to time to determine a number of poles slipped (NPS) value; and detecting, via a NPS comparator, that a pole has slipped when the NPS value is outside of a threshold range.

10. The method of claim 9, further comprising resetting a sum of the relative speed when the motor reaches synchronous speed.

11. The method of claim 9, further comprising resetting a sum of the relative speed until (i) the motor reaches synchronous speed, (ii) the motor is not in a starting condition, and (iii) the motor is not in a stopped condition.

12. The method of claim 9, wherein detecting, via the NPS comparator, that a pole has slipped comprises detecting an over-speed condition when the NPS value is less than approximately −1.

13. The method of claim 9, wherein detecting, via the NPS comparator, that a pole has slipped comprises detecting an under-speed condition when the NPS value is greater than approximately 1.

14. The method of claim 9, wherein determining a motor synchronous speed, $\omega_s$, comprising using a stored frequency value of one of: 50 Hz and 60 Hz.

15. The method of claim 9, wherein determining a motor synchronous speed, $\omega_s$, comprising measuring a frequency value of the power driving the motor.

16. The method of claim 9, wherein determining the angular speed value, $\omega_r$, of the rotor of the motor comprising measuring the angular speed value, $\omega_r$, using a shaft-mounted sensor system to directly measure the rotations per second of the rotor.

17. The method of claim 9, wherein the rotor speed sensor system comprises a radio frequency (RF) sensor configured to measure rotations of a shaft-mounted RF transmitter.

18. The method of claim 9, wherein the rotor speed sensor system comprises at least one accelerometer to measure an acceleration due to rotation of the rotor.

19. The method of claim 9, wherein the rotor speed sensor system comprises an active wireless communication component to wirelessly transmit information to derive the angular speed value, $\omega_r$.

* * * * *